United States Patent [19]

Sloane

[11] Patent Number: 4,841,471
[45] Date of Patent: Jun. 20, 1989

[54] SYSTEM FOR CONVERTING ANALOG SIGNALS TO A DISCRETE REPRESENTATION WITHOUT ALIASING

[75] Inventor: Edwin A. Sloane, Los Altos, Calif.

[73] Assignee: Schlumberger Technologies, Inc., San Jose, Calif.

[21] Appl. No.: 36,763

[22] Filed: Apr. 10, 1987

[51] Int. Cl.[4] .................................................. G06G 7/02
[52] U.S. Cl. ...................................... 364/825; 364/826
[58] Field of Search ................ 364/602, 604, 825, 826

[56] References Cited

U.S. PATENT DOCUMENTS 3,997,973 12/1976 Buss ................................. 364/825 X
4,092,725 5/1978 Hershman ..................... 364/825 X Primary Examiner—Steven Mottola
Attorney, Agent, or Firm—Theodore S. Park; Robert C. Colwell; Charles E. Krueger

[57] ABSTRACT

A network of filter elements for transforming an analog signal of infinite bandwidth into a discrete filter space representation having a bandwidth equal to $\pi$. In one embodiment the filter network includes Laguerre filter elements. Other embodiments include methods for estimating the values of the amplitudes, frequencies, and phases of the frequency components of the analog signal, for reconstructing an input signal, and correcting for non-ideal filter elements.

6 Claims, 4 Drawing Sheets

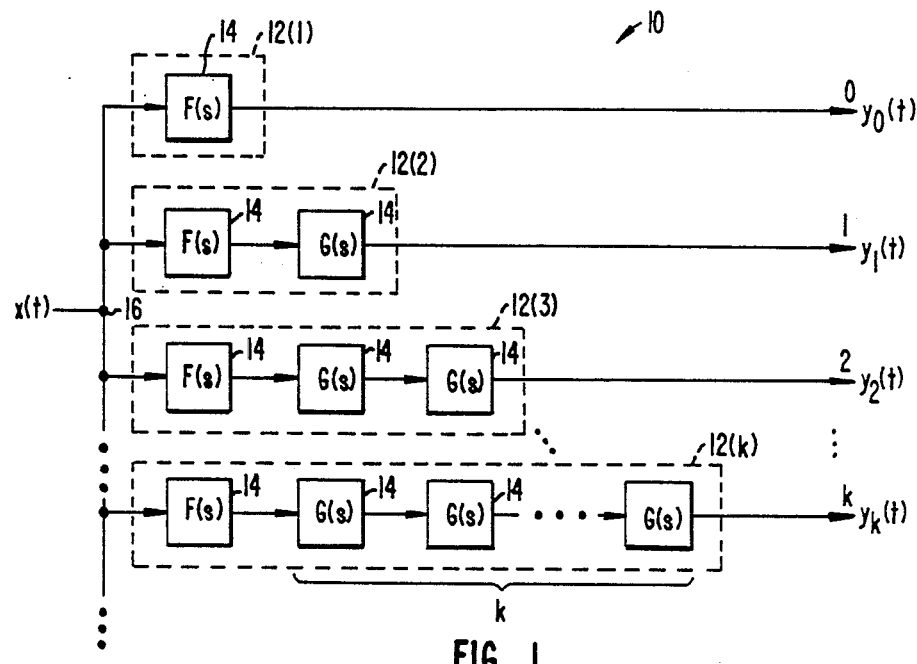
FIG._1.
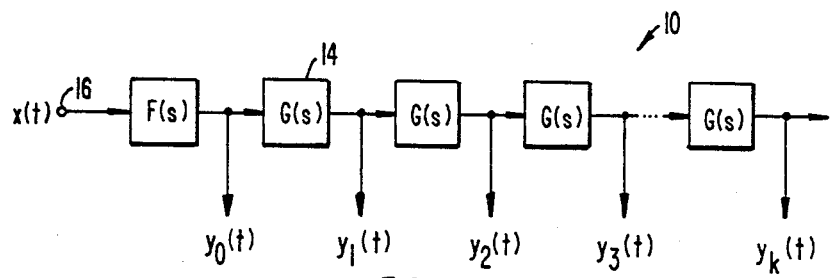
FIG._2.
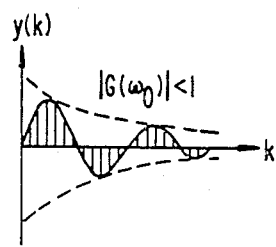
FIG._2A.
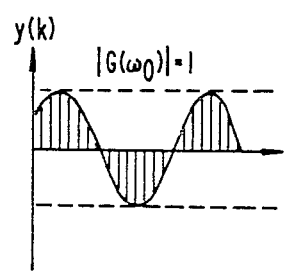
FIG._2B.
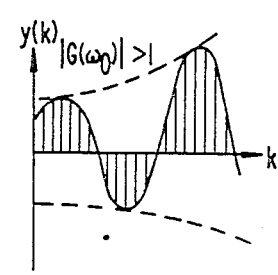
FIG._2C.

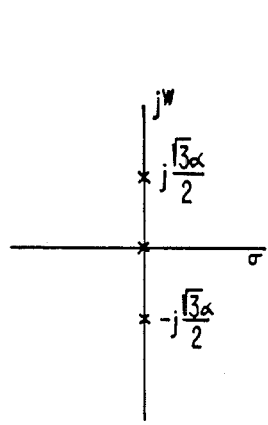
FIG._6A.
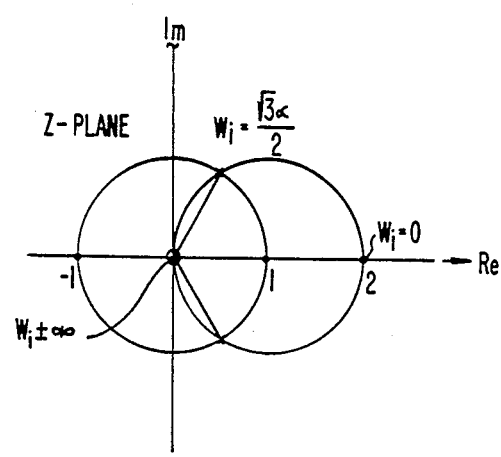
FIG._6B.
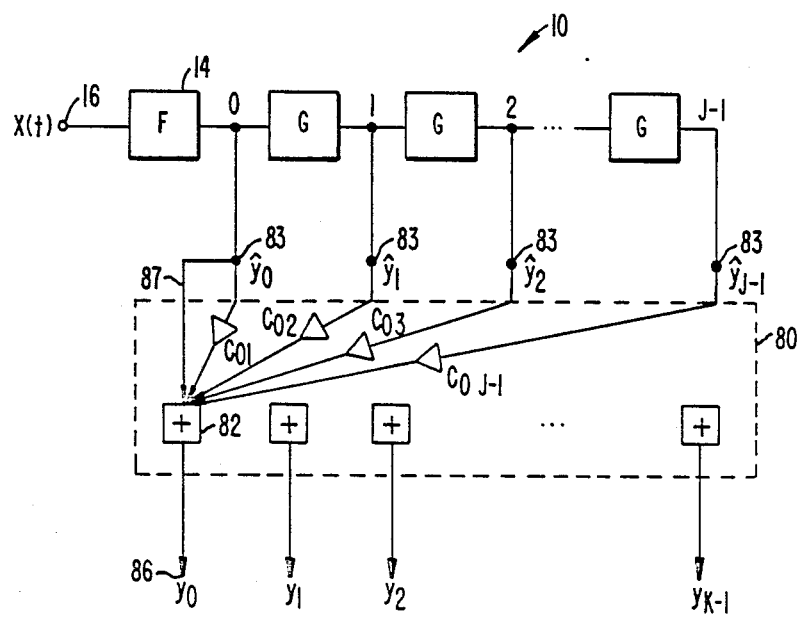
FIG._7.

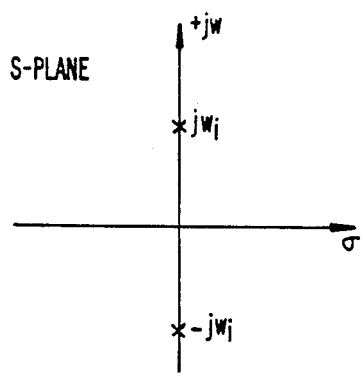
FIG._3A.
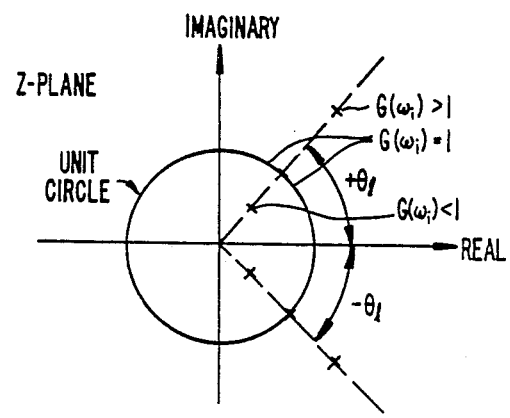
FIG._3B.
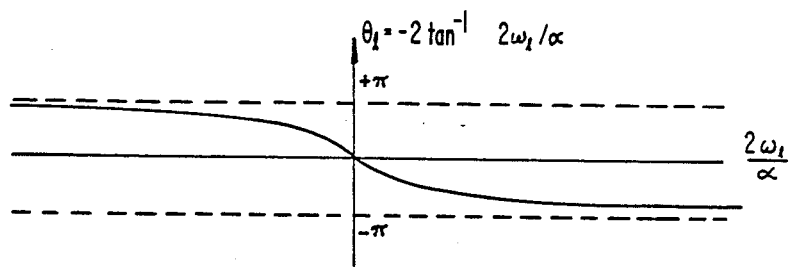
FIG._4.
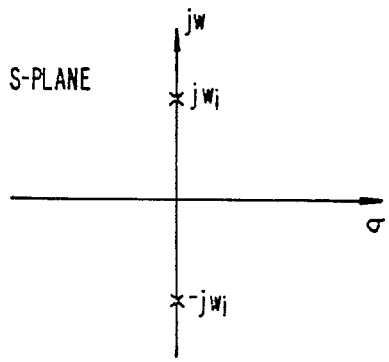
FIG._5A.
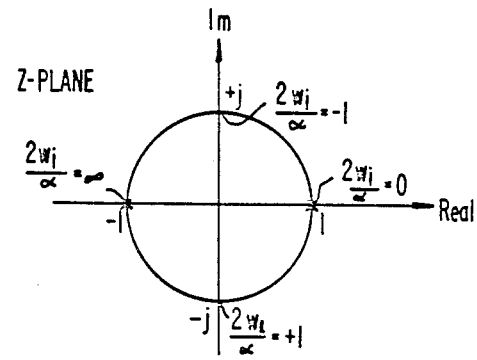
FIG._5B.

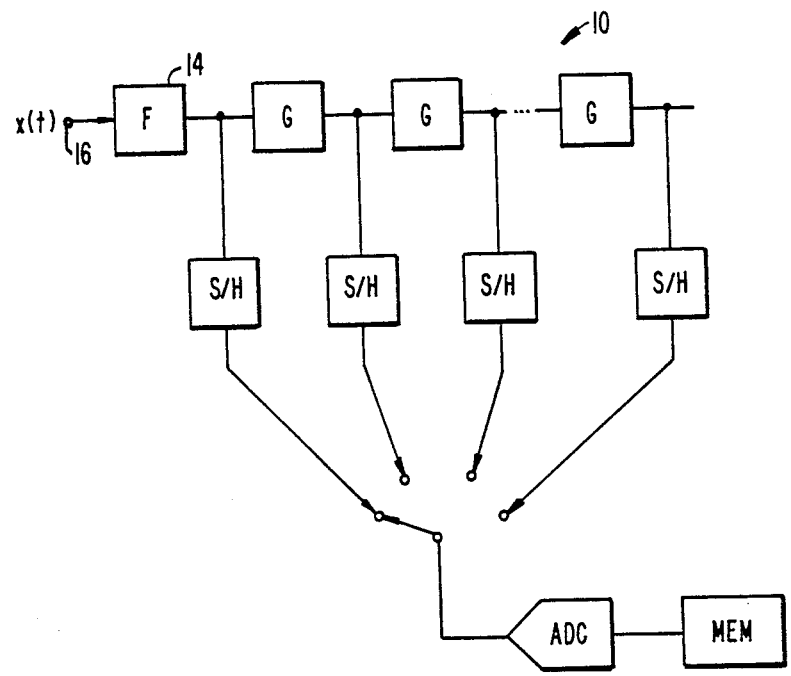
FIG._8.
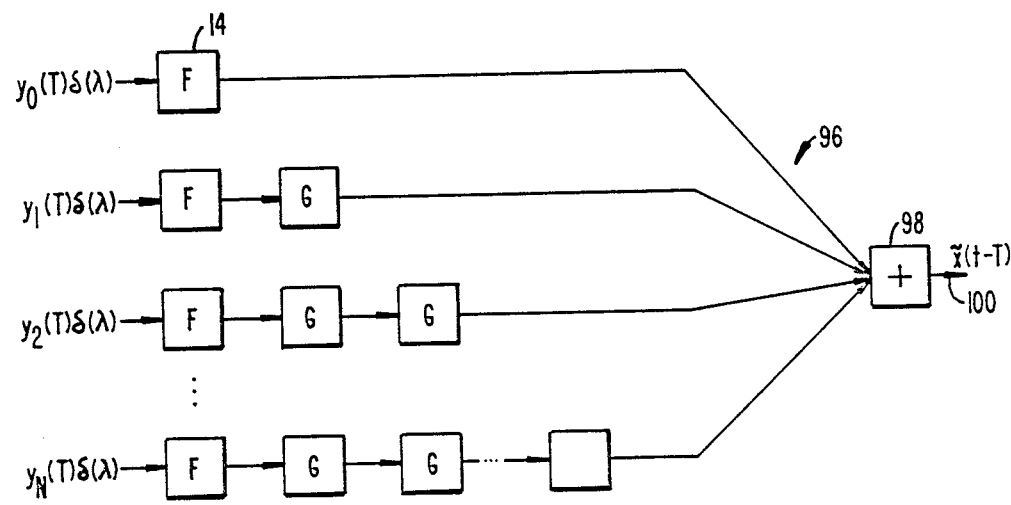
FIG._9.

SYSTEM FOR CONVERTING ANALOG SIGNALS TO A DISCRETE REPRESENTATION WITHOUT ALIASING

BACKGROUND OF THE INVENTION

Digital signal processing techniques performed on high-speed digital computers are utilized in many fields of technology including communications systems, test systems, defense systems and so on. Most signals of interest are analog signals, thus the conversion of a continuous analog signal to a discrete digital representation is a critical first step in any digital processing technique.

Generally, a discrete representation of an analog signal is obtained by sampling the analog signal at intervals of uniform duration, where the magnitude of the duration is T seconds.

The analog signal, $f(t)$, may be represented as a sum of frequency components $x_i(t)$ of the form $$f(t) = \Sigma x_i(t) = \Sigma A_i \cos(\omega_i t + \psi_i)$$

where the quantities $A_i$, $\omega_i t$, and $\psi_i$ are the amplitude, frequency, and phase of each frequency component.

If a maximum frequency, $\omega_{max}$, exists so that $x_i(t)$ is zero for $\omega_i > \omega_{max}$ the signal is said to be bandlimited. For an analog signal sampled at intervals of duration T, the sampled values accurately represent the analog signal if:

$$\pi/T \leq \omega_{max} \qquad \text{(Eq. A)}$$

Eq. A defines the Nyquist criterion. If the Nyquist criterion is not met the sampled values will include an aliasing error due to the existence of frequency components at frequencies above $\pi/T$.

A more complete discussion of the aliasing problem is discussed in the book by F. G. Stremler entitled *Introduction to Communication Systems*, Addison-Wesley, Mass. Second Ed., 1982.

The Nyquist criterion represents a design criterion for all sampling systems. Practical limitations on equipment and of cost limit the lower range of the sampling interval $T_{min}$. Thus, for test signals with $\omega_{max} > \pi/T_{min}$ the Nyquist criterion is violated. For these signals, pre-sampling filtering is employed to limit $\omega_{max}$. Again, ideal bandlimiting is not physically possible and approximating the ideal is prohibitively expensive. Thus, existing systems utilize expensive circuitry to reduce $T_{min}$ and to pre-filter the test signal while not completely obviating the aliasing problem.

Accordingly, a great need exists for a practical system to generate a discrete representation of a non-bandwidth limited signal that avoids introducing an aliasing error into the sampled representation.

SUMMARY OF THE INVENTION

The present invention is a system for sampling a non-bandwidth limited analog signal to produce a discrete representation of the signal that does not include an aliasing error.

In a preferred embodiment, the analog signal is applied to the input ports of a filter network having K ordered outputs. The transfer functions of the filter elements in the network are related so that the output signals from the filter network, sampled at time t, form a discrete representation of the analog signal. Further, for an analog signal having an infinite bandwidth, the bandwidth of the function represented by representation is equal to $\pi$. This bandwidth compression assures that the Nyquist criterion is satisfied for the discrete filter space representation and the problem of aliasing is obviated.

In a preferred embodiment, the filter network includes a set of K filter elements connected in series. In another preferred embodiment, the set of filter elements are connected in parallel branches. The transfer function, H(s), between the input port of the filter network and the kth ordered output of the filter element is of the form:

$$H_k(s) = F(s) \cdot G(s)^k$$

where F(s) is the transfer function of the first filter element in either the series connected set or the parallel branch and G(s) is the transfer function of the remaining filter elements. The variable $s = \sigma + jw$ is the s-plane complex frequency. For a steady state signal, G(s) and F(s) are evaluated only for $s = j\omega$, i.e., $G(s)|_{s=j\omega} = G(j\omega) = |G(\omega)e^{j\theta(\omega)}|$. These functions, F(s) and G(s), are complex functions and may be written in the form:

$$F(s) = |F(s)|e^{j\phi(s)}$$

and $$G(s) = |G(s)|e^{j\theta(s)}$$

where $|F(s)|$ and $|G(s)|$ are the respective moduli or amplitude of the complex function F(s) and G(s) and $\phi(s)$ and $\theta(s)$ are the respective phase terms of the functions F(s) and G(s), accordingly:

$$H_k(s) = |F(s)|e^{j\phi(s)} \cdot |G(s)|^k e^{k\theta(s)}. \qquad \text{(Eq. B)}$$

The functions F(s) and G(s) are selected so that the impulse responses at each filter network output are mutually linearly independent. Additionally, from Eq. B, the phase shift for a given spectral component at the kth output port is a linear function of the rank, k, of the output port.

If a steady state, analog signal, $f(t)$, is represented as a weighted sum of frequency components, i.e., $$f(t) = \sum_i A_i \cos(\omega_i t + \psi_i),$$

then for a given frequency component at $\omega_i$, the ratio of amplitudes of the output signals at successive output ports is $|G(\omega_i)|$ and the difference of the phases is $\theta(\omega_i)$ where $|G(\omega_i)|$ is the value of $|G(s)|$ and $\theta(\omega_i)$ is the value of $\theta(s)$ evaluated at $s = j\omega_i$.

According to one aspect of the invention, the filter elements are Laguerre filter elements with the impulse responses at the ordered output being in the form of Laguerre functions. In another embodiment, the filter elements are Poisson filters. In still another embodiment $|F(s)| = |G(s)|$. In another embodiment, F(s) may be arbitrary. In these embodiments, the bandwidth of an analog input signal is compressed into an interval of magnitude $\pi$ radians. This bandwidth compression obviates the aliasing problem.

The ratio of the amplitudes of successive output signals is a first constant and the difference of the phases is a second constant. For the transfer functions of Eq. B, the first constant is $|G(\omega)|$ and the second constant is $\theta(\omega)$ for each frequency component of the input signal.

According to a further aspect of the invention, the outputs of a set of filter elements having non-ideal transfer functions may be corrected by coupling the filter element output ports to a weight and sum correction network. This correction network includes weighting amplifiers coupling the filter element outputs to summing elements. The gain of each weighting amplifier is determined by the magnitude of a corresponding element in a correction matrix.

According to a further aspect of the invention, the correction for the non-ideal filter elements may be implemented numerically in a processor.

According to a further aspect of the invention, the outputs of the filter network are utilized to determine magnitudes of the frequency components of an analog input signal.

According to a still further aspect of the invention, the discrete sampled outputs of the filter network are utilized to reconstruct the sampled analog input signal.

Other features and advantages of the invention will become apparent in view of the following detailed description and appended claims.

BRIEF DESCRIPTION OF THE DRAWINGS

FIG. 1 is a schematic diagram depicting a filter network having parallel branches.

FIG. 2 is a schematic diagram depicting a filter network having serially connected filter elements with parallel outputs.

FIGS. 2A, 2B and 2C are graphs depicting the filter space output function for $|G(\omega_o)| < 1$, $|G(\omega_o)| = 1$, and $|G(\omega_o)| > 1$, respectively.

FIGS. 3A and 3B are graphs depicting the poles in the s-plane and the z-plane, respectively.

FIG. 4 is a graph depicting the frequency bandwidth compression of the filter network.

FIGS. 5A and 5B are graphs depicting the mapping of the poles in the s-plane and z-plane, respectively, for the Laguerre filter case.

FIGS. 6A and 6B are graphs depicting the mapping of the poles in the s-plane and z-plane, respectively, for the Poisson filter case.

FIG. 7 is a schematic diagram of a filter network coupled to a weight and sum network.

FIG. 8 is a schematic diagram of an embodiment including means for digitizing the sampled analog outputs.

FIG. 9 is a schematic diagram of a filter network for reconstructing an analog signal.

DETAILED DESCRIPTION OF THE PREFERRED EMBODIMENTS

The present invention is a system for discretely sampling a continuous test signal that is not necessarily bandwidth limited in the Nyquist sense. Sampled values may be utilized to determine the poles and residues and frequency spectrum of the test signal without aliasing effects.

Referring to FIG. 1, an embodiment of the invention useful for describing the operation of the system is depicted. A filter network 10 includes K parallel branches 12(k). The first parallel branch 12(1) includes a single filter element 14, the second parallel branch 12(2) includes two series connected filter elements 14, and so on. The input port of the first filter element 14 in each parallel branch 12 is connected to a network input port 16. The output ports of the last filter element 14 in each parallel branch 12 form the ordered output ports of the filter network 10.

The filter elements 14 are designed so that the parallel branches 12 are mutually linearly independent. This implies that each parallel branch 12 in the filter network 10 cannot be synthesized from a linear combination of other parallel branch 12. For example, a set of parallel branches 12 having mutually orthogonal impulse responses or transfer functions could belong to the admissible set of filter elements.

A second condition for the parallel branches 12 is that the phase shift at a given parallel branch output for a given input frequency component is a linear function of the rank of the output. This condition implies that the transfer function for each parallel branch is equal to $$H_k(s) = F(s) \cdot G^k(s) \tag{Eq. 1}$$

where $F(s)$ is the transfer function of first filter element in each parallel branch, $G(s)$ is the transfer function of the remaining filter elements in each parallel branch and s is the frequency in the complex frequency plane.

Referring now to FIG. 2, a structure equivalent to that depicted in FIG. 1 but structurally much simpler, is depicted. In FIG. 2, a set of K filter element are connected in series with the input port of the first filter element being the input port of the filter network 10 and the output of each filter element being the K ordered output ports of the filter network. The transfer functions between the input and each ordered output are defined by Eq. 1. The input signal, $x(t)$, is applied to the input port 16 of the filter network 10 and the output signals $y_k(t)$ are generated at the output ports of the filter elements.

The operation of the system depicted in FIG. 2 will now be described. When a continuous sinusoidal signal is applied to such a network 10 then the set of responses are also sinusoidal. For example, if $$x(t) = A_0 \cos \omega_0 t \tag{Eq. 2}$$

where and $\omega_0$ and $A_0$ are constant values and $$F(s) \big|_{s=j\omega_0} = F(j\omega_0) = |F(\omega_0)| e^{j\phi(\omega_0)} \tag{Eq. 3}$$

also $$G(s) \big|_{s=j\omega_0} = G(j\omega_0) = |G(\omega_0)| e^{j\theta(\omega_0)} \tag{Eq. 4}$$

where $|G(\omega_0)|$, $|F(\omega_0)|$, $\phi(\omega_0)$, and $\theta(\omega_0)$ are evaluated for the frequency variable $s=j\omega_0$ and where $\omega_0$ is equal to constant value. Thus, $|G(\omega_0)|$, $|F(\omega_0)|$, and $\theta(\omega_0)$ are also equal to constants. The functions $F(s)$ and $G(s)$ are evaluated at $s=j\omega_0$ because for a steady state signal only undamped components, i.e., $\sigma=0$, are present. Thus, $s = \sigma + j\omega = j\omega$.

Then the set of responses at the K ordered outputs are:

$$y_0(t) = A_0 |F(\omega_0)| \cos\{\omega_0 t + \phi(\omega_0)\} \tag{Eq. 5}$$

$$y_1(t) = A_0 |F(\omega_0)| \cdot |G(\omega_0)| \cos\{\omega_0 t + \phi(\omega_0) + \theta(\omega_0)\}$$

$$y_2(t) = A_0 |F(\omega_0)| \cdot |G(\omega_0)|^2 \cos\{\omega_0 t + \phi(\omega_0) + 2\theta(\omega_0)\}$$

$$y_3(t) = A_0 |F(\omega_0)| \cdot |G(\omega_0)|^3 \cos\{\omega_0 t + \phi(\omega_0) + 3\theta(\omega_0)\}$$

.
.
.

$$y_k(t) = A_0 |F(\omega_0)| \cdot |G(\omega_0)|^k \cos\{\omega_0 t + \phi(\omega_0) + k\theta(\omega_0)\}$$

.
.
.

$$y_{K-1}(t) = A_0 |F(\omega_0)| \cdot |G(\omega_0)|^{K-1} \cos\{\omega_0 t + \phi(\omega_0) + (K-1)\theta(\omega_0)\}$$

Note that the phase angle increments uniformly by $\theta(\omega_0)$ as a function of the output port number, k. Thus, the phase shift between successive output signals, $y_k(t)$, is the constant $\theta(\omega_0)$. This implies that when a sinusoid of frequency $\omega_0$ is applied to the input, then the simultaneous outputs of the ordered ports at the instant of time, t, will also describe a sinusoid as a function of the order, k, of the output ports. That is, the instantaneous outputs represent a sinusoidal function of the discrete variable k and angular argument $\theta(\omega_0)$.

The argument $k\theta(\omega_0)$ in the cosine term of the output function in the filter network domain is analogous to the term $\omega_0 t$ of the test signal in the time domain. At a given instant of time, t, the output signals, $\{y_k(t)\}$, are modulated from port to port according to $\cos(\theta(\omega_0)k + Q_0)$ where $Q_0$ is $(\omega_0 t + \phi(\omega_0))$. Because k is an integer, a discrete representation has been obtained from a continuous input signal. Now, consider the maximum amplitude or envelope terms of the form $$|y_k(t)|_{env} = |A_0| \cdot |F(\omega_0)| \cdot |G(\omega_0)|^k \quad \text{(Eq. 6)}$$

Note that $A_0 |F(\omega_0)|$ is a constant scaling term, independent of k, while $|G(\omega_0)|^k$ is a function of the filter bank index, k. The ratio of gains between successive outputs is thus the constant $G(\omega_0)$.

Because $|G(\omega_0)|$ is a real constant it will modify the envelop of the discrete sinusoid depending upon the value of k as follows:

If $|G(\omega_0)| < 1$, the envelope will be a decaying exponential;
if $|G(\omega_0)| = 1$, the envelope will be of constant value;
If $|G\omega_0)| > 1$, the envelope will be a rising exponential.

Thus, each input constant amplitude continuous sinusoid will be mapped (transformed) into a discretely sampled sinusoid with angular increment $\theta(\omega_0)$ and an exponential envelope of the form $$|A_0| \cdot |F(\omega_0)| \cdot |G(\omega_0)|^k = |A_0| \cdot |F(\omega_0)| e^{\alpha_0 k} \quad \text{(Eq. 7)}$$

where $$|G(\omega_0)| = e^{\alpha_0}$$

and $$\alpha_0 = \ln|G(\omega_0)|. \quad \text{(Eq. 7a)}$$

The output signal of the filter network 10 as a function of the rank, k, if the output ports is graphed in FIGS. 2A, 2B, and 2C.

Because the filter bank is a linear network, the principle of superpositioning applies, so that if a composite signal of many sinusoids in the form $$x(t) = \sum_{i=0}^{\infty} A_i \cos(\omega_i t + \psi_i) = \sum_{i=0}^{\infty} x_i(t) \quad \text{(Eq. 8)}$$

where $x_i(t) = A_i \cos(\omega_i t + \psi_i)$ is applied, where $\omega_i$ is the frequency, $A_i$ is the amplitude, and $\psi_i$ is the phase of each frequency component, each frequency component will be transformed into a discrete representation of similar but not identical responses. Each representation will be unique if either the gain term, $|G(\omega)|$, or phase increment term, $\theta(\omega)$, is different for each input frequency because for each constant amplitude input sinusoid of frequency, $\omega_i$, and arbitrary phase angle, $\psi_i$, the following transformation pair will hold $$A_i \cos\{\omega_i t + \psi_i\} \rightleftharpoons \quad \text{(Eq. 9)}$$

$$A_i |F(\omega_i)| e^{\alpha_i k} \cos\{k\theta_i + Q_i\}$$

where $$\theta_i = \theta(\omega_i), \quad \alpha_i = \ln|G(\omega_i)|$$

and $$Q_i = \omega_i t + \phi(\omega_i) + \psi_i. \quad \text{(Eq. 10)}$$

For a particular value of $\omega_i$, the quantities $\theta_i$, $\alpha_i$, and $Q_i$ are equal to constant values.

The transformation effected by the filter network 10 is illustrated in FIGS. 3A and B. A frequency component of the test signal is defined by the expression $$x_i(t) = A_i \cos(\omega_i t + \psi_i). \quad \text{(Eq. 11)}$$

From Eq. 9, each frequency component is transformed into a filter space component at time t. FIG. 3A is a graph depicting the poles of frequency component of Eq. 11. Note that the poles $$s_i = \pm j\omega_i \quad \text{(Eq. 12)}$$

are on the imaginary axis of s-plane. The corresponding residues are:

$$r_i = (A_i/2) e^{\pm j\psi_i}. \quad \text{(Eq. 13)}$$

The poles of the transformed function:

$$y_i(k) = |A_i| \, |F(\omega_i)| \cdot e^{\alpha_i k} \cdot \cos(k\theta_i + Q_i) \quad \text{(Eq. 14)}$$

are depicted in FIG. 3B and are shown to be at $$z_i = e^{\alpha_i} e^{\pm j\theta_i} = |G(\omega_i)| e^{\pm j\theta_i} \quad \text{(Eq. 15)}$$

and the residues are:

$$p_i = \tfrac{1}{2} A_i |F(\omega_i)| e^{\pm jQ_i} \quad \text{(Eq. 16)}.$$

The complex conjugate pole pair at $s_i = \pm j\omega_i$ is transformed into another complex conjugate pole pair in the z-plane at $$z_i = e^{\alpha_i} e^{\pm j\theta_i}. \tag{5}$$

The original poles were on the imaginary axis of the s-plane because of the constant amplitude assumption. The mapping in the z-plane is at an angle of $\pm \theta_i$ and at a radial distance of $$e^{\alpha_i} = |G(\omega_i)|.$$

This again implies that if $$e^{\alpha_i} = 1$$

then the sampled sinusoid will also be of constant amplitude because the poles will lie at $$z = e^{\pm j\theta_i}$$

on the unit circle. If $$e^{\alpha_i} < 1,$$

then it will be within the unit circle, otherwise outside.

Because the Fourier series expansion of any general arbitrary length sequence assures us that it may be represented by a weighted sum of constant magnitude sinusoids, the network described is capable of representing (transforming) such a function as a discretely sampled function with each frequency uniquely mapped onto the z-plane.

The poles and residues of the transformed function are calculated from the sampled values, $y_k$, utilizing standard techniques described, for example, in a book by Willsky entitled Digital Signal Processing and Control and Estimation Theory, The MIT Press, Cambridge, MA, Second Printing (1979), pp. 25-67. Once these poles ($z_i$) and residues ($\rho_i$) are calculated the $A_i$, $\omega_i$, and $\psi_i$ may be determined as follows.

First, the filter elements 14 are selected so that $G(\omega)$ and $F(\omega)$ are known analytical functions. From equations 4, 7, 7a, and 15 it follows that:

$$\ln z_i = \alpha_i + j\theta_i = \ln G(j\omega_i) \tag{Eq. 17}$$

and $$\ln z_i^* = \alpha_i - j\theta_i = \ln G^*(j\omega_i) \tag{Eq. 18}$$

or $$\alpha_i \pm j\theta_i = \ln\{|G(\omega)|\} \pm j\theta(\omega_i) \tag{Eq. 19}$$

thus $$\alpha_i = \ln\{|G(\omega_i)|\} \tag{Eq. 20}$$

and $$\theta_i = \theta(\omega_i) \tag{Eq. 21}$$

As described above, $\alpha_i$ and $\theta_i$ are known because the poles, $z_i$, have been calculated from the sampled values, $y_k$. Also, $|G(\omega)|$ and $\theta(\omega)$ are the known transfer functions of the filter elements. Thus, $\omega_i$ can be calculated from either Eq. 20 or 21.

From Eq. 16;

$$\rho_i = \tfrac{1}{2} A_i |F(\omega_i)| e^{\pm jQ_i} = |\rho_i| e^{\pm jQ_i} \tag{Eq. 22}$$

where $\rho_i$ is a known complex number of the form:

$$\rho_i = Re\{\rho_i\} + i\, Im\{\rho_i\}$$

Thus, $$|\rho_i| = \{(Re\{\rho_i\})^2 + (Im\{\rho_i\})^2\}^{\frac{1}{2}} \tag{Eq. 23}$$

and from Eq. 22;

$$A_i = \frac{2|\rho_i|}{|F(\omega_i)|} \tag{Eq. 24}$$

and, because $|\rho_i|$, $\omega_i$, and $|F(\omega_i)|$ are known quantities the value $A_i$ may be calculated.

Similarly, from Eq. 22:

$$Q_i = \tan^{-1}\left(\frac{Im\{\rho_i\}}{Re\{\rho_i\}}\right) \tag{Eq. 25}$$

and $$\psi_i = \tan^{-1}\left(\frac{Im\{\rho_i\}}{Re\{\rho_i\}}\right) - \omega_i t - \theta(\omega_i) \tag{Eq. 25a}$$

Thus, the value of $\psi_i$ may be calculated because $Im\{\rho_i\}$, $Re\{\rho_i\}$, $\omega_i t$, and $\theta(\omega_i)$ are known quantities. Thus, the frequency, $\omega_i$, amplitude, $A_i$, and phase $\psi_i$ is determined.

A particular set of filters satisfying this requirement is the orthonormal set having Laguerre functions for its set of impulse response. In other words, the kth order impulse response, $h_k(t)$, defined as the impulse response at the kth output port to a signal applied to the filter network input port is $$h_k(t) = l_k(\alpha t) = (-1)^k \sqrt{\alpha}\, e^{-\alpha t/2} L_k(\alpha t) \tag{Eq. 26}$$

where $L_k(x)$ is the kth order Laguerre polynomial given by $$L_k(x) = (-1)^k \sum_{q=0}^{k} \frac{k!(-x)^q}{(k-q)!q!q!} \tag{Eq. 27}$$

where $\alpha$ is a scaling parameter so that $$h_k(t) = \sqrt{\alpha}\, e^{-\alpha t/2} (-1)^k \sum_{q=0}^{k} \frac{k!(-\alpha t)^q}{(k-q)!q!q!} \tag{Eq. 28}$$

The corresponding Laplace transform, or transfer function is $$h_k(t) \rightleftharpoons H_k(s) = \frac{(-1)^k \sqrt{\alpha}}{s + \alpha/2} \left(\frac{s - \alpha/2}{s + \alpha/2}\right)^k = \frac{\sqrt{\alpha}}{s + \alpha/2} \cdot \left(\frac{\alpha/2 - s}{\alpha/2 + s}\right)^k \tag{Eq. 29}$$

which has the desired form $F(s) \cdot G^k(s)$.

Also, because $$|G(s)| = 1$$

any constant amplitude sinusoid maps into a constant amplitude sampled sinusoid. Also, $$G(\omega_i) = \frac{s - \alpha/2}{s + \alpha/2}\bigg|s = j\omega_i = \frac{-j\omega_i + \alpha/2}{j\omega_i + \alpha/2} = \quad \text{(Eq. 30)}$$

$$e^{-2j\tan^{-1}2\omega_i/\alpha}$$

so that $$\theta_i = -2\tan^{-1}(2\omega_i)/\alpha \quad \text{(Eq. 32)}$$

or $$\omega_i = -\alpha/2 \tan \theta_i/2 \quad \text{(Eq. 33)}$$

This relationship is shown in FIG. 4 which is a graph of $\theta_i$ as a function of $2\omega_i/\alpha$. The significance of this transformation is that as $\omega_i$ approaches $\pm\infty$, $\theta_i$, the discrete angular increment, approaches $\pm\pi$ and at $\omega_i = 0$, $\theta_i = 0$.

Thus, the upper bound of the bandwidth of the transformed signal is inherently limited to $\pi$ and the infinite bandwidth of the signal is compressed to finite quantity.

In applying the Nyquist criterion, $\theta_i k$ in the filter space domain in analogues $\omega_i t$ in the time domain. As described above, in the discussion of equation A, the Nyquist criterion is satisfied for a sampled function in the time domain when:

$$\omega_{imax} = \pi/T$$

In the present system, the sampling interval is the increment in the rank, k, of the outputs, i.e., $\Delta k = 1$. The Nyquist criterion in the filter space domain is:

$$\theta_{max} = \pi/\Delta k = \pi \quad \text{(Eq. 34)}$$

Because the value of $\theta_{imax}$ only approaches $\pi$ in the limiting case, $\omega_{max} \to \infty$, the Nyquist criterion is always satisfied.

FIGS. 5A and B are graphs of the poles of frequency components for a set of Laguerre filters in the s-plane and the poles of the transformed, discrete functions in the z-plane.

It is concluded that all frequencies on the $j\omega$ axis of the s-plane are mapped, without aliasing, onto the unit circle of the z-domain.

In addition, all of the necessary information to reconstruct the original signal has been preserved because the response of the kth filter to the sinusoid $$A_1 \cos\{\omega_i t + \psi_i\} \quad \text{(Eq. 35)}$$

is $$y_k(t) = A_i \left| \frac{\sqrt{\alpha}}{\sqrt{\omega_i^2 + (\alpha/2)^2}} \right| \cdot$$

$$\cos\{\omega_i t + \psi_i - \tan^{-1}2\omega_i/\alpha - 2k\tan^{-1}2\omega_i/\alpha\}$$

or, $$y_k(t) + 2|\rho_i|\cos\{\theta_i k + Q_i\}. \quad \text{(Eq. 36)}$$

Where, $$Q_i = \omega_i t + \psi_i - \tan^{-1}2\omega_i/\alpha \quad \text{(Eq. 37)}$$

so that $$\psi_i = Q_i - \omega_i t + \tan^{-1}2\omega_i/\alpha. \quad \text{(Eq. 38)}$$

Hence, if the ordered outputs, $\{y_k(t)\}$ are sampled simultaneously, at a known time, t, then the technique described with reference to equations 17–21 may be utilized to determine $\omega_i$. The knowledge of $\omega_i$ allows the evaluation of the phase angle $\psi_i$. Similarly, $$A_i = 2|\rho_i| \cdot \left| \frac{\sqrt{\omega_i^2 + (\alpha/2)^2}}{\sqrt{\alpha}} \right| \quad \text{(Eq. 39)}$$

which is a sufficient relationship to determine $A_i$ having estimated the sampled sinusoids residue.

Another simple set of filters that may be used are the Poisson set which have an impulse response for the kth ordered filter as follows:

$$h_k(t) = \frac{(\alpha t)^k}{k!} e^{-\alpha t/2} \quad \text{(Eq. 40)}$$

which has the form of a Poisson probability density function. Its Laplace transform is given by $$h_k(t) \rightleftharpoons H_k(s) = \frac{1}{s + \alpha/2} \left( \frac{\alpha}{s + \alpha/2} \right)^k \quad \text{(Eq. 41)}$$

so that $$F(s) = \frac{1}{s + \alpha/2} \quad \text{(Eq. 42)}$$

and $$G^k(s) = \left( \frac{\alpha}{s + \alpha/2} \right)^k. \quad \text{(Eq. 43)}$$

Hence $$F(j\omega_i) = \frac{1}{j\omega_i + \alpha/2} = \frac{e^{-j\tan^{-1}(2\omega_i/2)}}{\sqrt{(\alpha/2)^2 + \omega_i^2}} \quad \text{(Eq. 44)}$$

and $$G(j\omega_i) = \frac{\alpha}{\sqrt{(\alpha/2)^2 + \omega_i^2}} e^{-j\tan^{-1}(2\omega_i/2)} \quad \text{(Eq. 45)}$$

Hence, the transform pair relating the unsampled to the sampled sinusoid is $$A_i \cos\{\omega_i t + \psi_i\} \rightleftharpoons \frac{A_i}{\sqrt{(\alpha/2)^2 + \omega_i^2}} e^{\alpha ik} \quad \text{(Eq. 46)}$$

$$\cos\{\omega_i t + \psi_i - \tan^{-1}(2\omega_i/\alpha) - k\tan^{-1}(2\omega_i/\alpha)\}$$

so that $$\alpha_i + j\theta_i = \frac{\alpha}{\sqrt{(\alpha/2)^2 + \omega_i^2}} - j\tan^{-1}2\omega_i/\alpha \quad \text{(Eq. 47)}$$

or

-continued $$\alpha_i = \frac{\alpha}{\sqrt{(\alpha/2)^2 + \omega_i^2}} \quad \text{(Eq. 48)}$$

and $$\theta_i = -\tan^{-1}(2\omega_i/\alpha) \quad \text{(Eq. 49)}$$

or $$\omega_i = -(\alpha/2)\tan\theta_i. \quad \text{(Eq. 50)}$$

Also $$A_i = 2|\rho_i| \cdot \sqrt{(\alpha/2)^2 + \omega_i^2} \quad \text{(Eq. 51)}$$

where $$|\rho_i| = \tfrac{1}{2}\frac{A_i}{\sqrt{(\alpha/2)^2 + \omega_i^2}} \quad \text{(Eq. 52)}$$

Further, $$\psi_i = Q_i - \omega_i t + \tan^{-1}(2\omega_i/\alpha) \quad \text{(Eq. 53)}$$

The Poisson filter set is related to the Laguerre filter set by a simple linear transformation:

$$\begin{vmatrix} l_0(\alpha t) \\ l_1(\alpha t) \\ l_2(\alpha t) \\ l_3(\alpha t) \\ \cdot \\ \cdot \\ l_N(\alpha t) \end{vmatrix} = \sqrt{\alpha} \begin{vmatrix} 1 & & & & \\ -1 & 1 & & & \\ 1 & -2 & 1 & & \\ -1 & 3 & -31 & & \\ \cdot & & & & \\ \cdot & & & & \\ (-1)^N & \cdot & \cdots & 1 \end{vmatrix} \begin{vmatrix} p_0(\alpha t) \\ p_1(\alpha t) \\ p_2(\alpha t) \\ p_3(\alpha t) \\ \cdot \\ \cdot \\ p_N(\alpha t) \end{vmatrix} \quad \text{(Eq. 54)}$$

Where the kth row vector is the binomial coefficients given by the relationship $$l_k(\alpha t) = (-1)^k \sqrt{\alpha} \sum_{q=0}^{k} \frac{(-1)^q k!}{(k-q)!q!} p_q(\alpha t) \quad \text{(Eq. 55)}$$

where $$p_k(\alpha t) = \frac{(\alpha t)^q}{q!} e^{-(\alpha t/2)} \quad \text{(Eq. 56)}$$

Because $$\theta_i = -\tan^{-1}(2\omega_i/\alpha) \quad \text{(Eq. 57)}$$

the Poisson filter set maps the entire infinite frequency band, $-\infty < \omega < +\infty$, onto the sector, $|\theta_i| \leq \pi/2$, of the z-plane. However, unlike the Laguerre filters, $|G(\omega)| \neq 1$ except when $\omega = \sqrt{3}(\alpha/2)$ and hence has at most only one complex conjugate frequency pair on the unit circle of the z-plane.

All of the $j\omega$-axis poles of the s-plane lie on the z-plane on the unit circle centered at $z=1$, or $$z_i = 1 + e^{-j\tan(2\omega_i/\alpha)} \quad \text{(Eq. 58)}$$

FIGS. 6A and 6B are graphs depicting the above-described mapping of the poles.

However, given the response of the Poisson filter bank to an input x(t), the response of a Laguerre filter can be obtained based on the previous equations. Given $$l_k(\alpha t) = (-1)^k \sqrt{\alpha} \sum_{q=0}^{k} \frac{(-1)^q k!}{(k-q)!q!} p_q(\alpha t) \quad \text{(Eq. 59)}$$

Then the response of $l_k(\alpha t)$ to x(t) is the convolution $$x(t)*l_k(\alpha t) = (-1)^k \sqrt{\alpha} \sum_{q=0}^{k} \frac{(-1)^q k!}{(k-q)!q!} p_q(\alpha t) \cdot x(t) \quad \text{(Eq. 60)}$$

so that if the qth Poisson output is $$y_q(t) = x(t) \cdot p_q(\alpha t) \quad \text{(Eq. 61)}$$

then $$x(t)*l_k(\alpha t) = (-1)^k \sqrt{\alpha} \sum_{q=0}^{k} \frac{(-1)^q k!}{(h-q)!q!} Y_q(t) \quad \text{(Eq. 62)}$$

bacause $$p_k(\alpha t) = -(1/\sqrt{\alpha}) \sum_{q=0}^{k} \frac{(-1)^q k!}{(h-q)!q!} l_q(\alpha t) \quad \text{(Eq. 63)}$$

A similar linear relationship exists between the output of the Laguerre filter bank and the Poisson filter bank. Circuits for realizing Laguerre and Poisson filter elements are described in a book by A. B. Williams entitled Electronic Filter Design Handbook, McGraw-Hill, New York (1981), pp. 7-1 through 7-14, and also Y. W. Lee, Statistical Theory of Communication, John W. Ley & Sons, Inc. (1980) Ch. 19.

This leads to a further generalization of the family of filters that are admissible for this application. In matrix notation, let the two column vectors l and h be Let $l = [l_0(\alpha t) l_1(\alpha t) l_2(\alpha t) \ldots l_{N-1}(\alpha t)]^T$ (Eq. 64)

and $h = [h_0(t) h_1(t) h_2(t) \ldots h_{N-1}(t)]^T$ (Eq. 65)

Then if $h = Al$, (Eq. 66)

where A is an NxN non-singular (invertible) matrix, the set of filters with impulse responses, $\{h_k(t)\}$, are equivalent to the Laguerre filters because the matrix A is a linear mapping of l into h. The inverse mapping takes the form $l = A^{-1} h$ (Eq. 67).

In summary, if the impulse responses of a bank of filters can be represented as a one-to-one transformation with the Laguerre functions, then the set of filters is suitable. A consequence of this observation is that this relationship may be used to correct a set of less than ideal filters.

Consider the case where a bank of approximate Laguerre filters having a vector of impulse responses represented by the column vector $\hat{l}$. Let the relationship between $\hat{l}$ and the ideal, l, be denoted by the matrix A, then $\hat{l} = Al$ (Eq. 68)

where $A = I + E$ and

I is the identity matrix

E is the error matrix whose rows represent the Laguerre function coefficients describing the error.

If A is restricted to a square matrix then $$l = A^{-1}\hat{l} \qquad \text{(Eq. 69)}$$

If the input is represented by x(t), convolving both sides with x yields $$l*x = A^{-1}\hat{l}*x \qquad \text{(Eq. 70)}$$

But $$\hat{l}*x = \hat{y} \qquad \text{(Eq. 71)}$$

where $$\hat{y} = [\hat{y}_0(t)\hat{y}_1(t)\hat{y}_2(t)\ldots\hat{y}_{N-1}(t)]^T \qquad \text{(Eq. 72)}$$

and is the column vector representing the output of the filter bank.

Also $$l*x = y$$

where y is the corrected output vector. Thus $$y = A^{-1}\hat{y} = \hat{y} + C\hat{y} \qquad \text{(Eq. 73)}$$

where $$A^{-1} = I + C \qquad \text{(Eq. 74)}$$

and C is the correction matrix.

In FIG. 7, the weight and sum network 80 is depicted including only a single summing element 82. The function of the network may be adequately described from FIG. 7 although in practice a summing element 82 for each output $y_k$ is required. The elements, $c_{ij}$, of the correction matrix, C, may be determined by applying sinusoidal test signals to the filter network 10 and utilizing Eqs. 68–74.

The output terminals $\hat{y}_j$ 83 of the filter network 10 are coupled to the input ports of the summing element 82 via respective weighting amplifiers, $c_{ij}$, 84. These weighting amplifiers may be realized as standard operational amplifiers. Additionally, the $I_{ij}$ term of the identity matrix is represented by a direct connection 87 between $\hat{y}_j$ and the summing element 82. The output port 86 of summing elements 82 are the output ports of the weight and sum network 80.

In operation, the gain of the weighting amplifier 84 coupling the jth filter output port 84 to the ith summing element 82 is set equal to $c_{ij}$, i.e., the element of the correction matrix at ith row and kth column.

Other approximate error correction schemes may be used such as using an approximate inverse to the A matrix:

$$A^{-1} = [I+E]^{-1} \approx I - E \qquad \text{(Eq. 75)}$$

Hence $$l \approx [I-E]\hat{l}*x = [I-E]\hat{y} \qquad \text{(Eq. 76)}.$$

Also, if A is not a square matrix because the number of $\hat{y}_k$ terms to be corrected is less than the total number of filter outputs, or if the number of $\hat{y}_k$ terms needed to correct all of the filter outputs is less than the total number of filter outputs, the psuedo-inverse of A may be employed. In the first case (A is N×M, N>M)

$$l = (A^T A)^{-1} A^T \hat{l} \qquad \text{(Eq. 77)}$$

while in the second (A is N×M, N<M)

$$l = A^T(A A^T)^{-1}\hat{l} \qquad \text{(Eq. 78)}.$$

This same procedure may be used for correcting the characteristics or any other admissible set of filters because they may be synthesized from the Laguerre filter set (Ref. Lee, Y. W., "Statistical Theory of Communication," John Wiley & Sons, Inc., 1960, Ch. 19, pp. 483–485).

The outputs of the filter bank or connection matrix may each be connected to an analog-to-digital converter (ADC), possibly including a sample and hold (S/H) network, and sampled simultaneously. Alternatively, a lesser number of ADC units could be used in conjunction with S/H networks, signal multiplexers, and a limited set of ADC units.

FIG. 8 depicts a configuration using a single, multiplexed ADC with a multiplicity of S/H networks coupled to the ADC through a multiplexer (selector switch).

Once the data is captured, the pertinent information may be extracted in many ways, depending on the specific application. For example, if Laguerre filters or an equivalent set of filters that are a linear transform of Laguerre filters are used, it is possible to reconstruct the original signal from the coefficients (simultaneously sampled values) obtained at the filter bank output by means of the inverse Laguerre transformation.

$$\bar{x}(t-T) = \sum_{k=0}^{n} y_k(T)l_k(-\alpha t), \quad -\infty < t \leq T \qquad \text{(Eq. 79)}$$

where $y_k(T)$ is the kth output.

Because the Laguerre functions are exponential discounted, the accuracy of reconstruction will generally be better for a restricted range of t, representing the most immediate past. The reconstruction may be formed numerically in a computer, or by an analog network.

FIG. 9 depicts an analog reconstruction network 90. The network includes N parallel branches 92, as described in FIG. 1, with each parallel branch having an input port 94 for receiving an input signal $y_k(T)\delta(\lambda)$ and an output port 96 coupled to the input ports of a summing element 98. The reconstructed function, $\bar{x}(t-T)$, is generated at the output port 100 of the summing element 98.

The functions $F(\omega)$ and $G(\omega)$ have been previously defined; $y_k\delta(t-\lambda)$ is an impulse of magnitude $y_k$ applied at some arbitrary time $t=\lambda$, $\lambda \geq T$. Clearly, a single impulse could be applied simultaneously to all filter inputs whose gains have been adjusted to be proportional to $y_k(T)$ and yield the same output $\bar{x}(t-T)$.

If a transformation of basis functions such as from Laguerre to Poisson, or vice versa, is required. A transformation network corresponding to the $A^{-1}$ network shown in FIG. 7 for correction purposes may be employed or the transformation may be accomplished numerically. In this context, the transformation from $\hat{y}_k$ to $y_k$ by this network is simply a linear mapping of the basis functions $\{\hat{y}_n\}$ into $\{y_k\}$. Thus, a linear transformation, A, and correction, B, may be simultaneously applied by a single network, C, where $$C = A \cdot B \quad \text{(Eq. 80)}$$

or $$C = B \cdot A \quad \text{(Eq. 81)}$$

depending on whether the correction is relative to the new or original basis functions.

The purpose for allowing a selection of basis functions is that the efficiency of representation is not equal, i.e., the number of coefficients required to achieve a given error in reconstruction of a signal will generally differ (and sometimes dramatically differ) depending on the "similarity" of the basis functions and the signal. For example, consider the represenatation of an exponential, $e^{-\alpha t/2}$, by Fourier series and Laguerre functions series:

$$e^{-\alpha t/2} = \sum_{h=-\infty}^{+\infty} C_n e^{-(\alpha/2 + jn\omega_0)t} \quad 0 < t < 2\pi/\omega_0 \quad \text{(Eq. 82)}$$

where $$C_n = \int_0^T e^{-t/2} e^{-jn\omega_0 t} dt \quad \text{(Eq. 83)}$$

which implies an infinite number of coefficients for the Fourier expansion, while for the Laguerre expansion $$e^{-\alpha t/2} = (1/\sqrt{\alpha}) l_0(\alpha t) \quad \text{(Eq. 84)}$$

which implies a single coefficient ($1/\sqrt{\alpha}$ in this case).

Processing of the set of coefficients, $\{y_k(T)\}$, may also involve spectral analysis by means of, say, one of the FFT algorithms. Direct application of the FFT to the sampled data represented by the coefficients will generally result in a frequency warping which may be useful when monitoring a large signal spectrum for activity. Or, if the warping is not desired, it is possible to remap (linearize) the frequency scale by the relationships previously established.

Finally, because these reconstructions generally cover the infinite past, but usually with better accuracy for the recent past, the system may be employed to reduce the requirement for very high speed ADCs by taking these parallel samples at intervals less than the Nyquist rate for the original signal. Careful selection of a basis function for a given input signal, $x(t)$, will maximize this sample interval.

For example, it has been shown (E. A. Sloane, et al., U.S. Pat. No. 4,045,616, Vocoder System, filed May 22, 1975) that damped sinusoids used as a set of basis functions provide faithful reproduction of voice signals when updated approximately every 100 milliseconds or 10 updates per second. Telephone quality voice signals are normally sampled at 8000 samples per second (which is the update rate for conventional PCM systems). The ratio of update intervals is 800 to 1.

The invention has been described with reference to specific embodiments. Modifications and substitutions will now be apparent to persons of ordinary skill in the art. For example, configurations utilizing parallel branching and series connected filter elements have been described, however, other configurations may be utilized to realize the advantages of the invention. Further, filter elements having other than Laguerre or Poisson impulse responses may be utilized. Additionally, a network where $G(\omega) = F(\omega)$ may be utilized. In another embodiment, $F(\omega)$ may be arbitrary. Further, the analog network depicted in FIG. 7 is exemplary of one technique for performing a matrix operation on a set of sampled filter network output signals. Alternatively, the sampled signal values could be converted to digital equivalents and the matrix operation could be performed by a digital computer. The matrix operation may effect a change of basis functions or a correction. Accordingly, the scope of the invention is not limited except as provided in the appended claims.

What is claimed is:

1. A method for calibrating a system for correcting transfer functions of a non-ideal series filter network comprising:

providing a filter network of non-ideal filter elements, having an input port for receiving a test signal and having J ordered output ports for generating J ordered output signals at respective output ports, with the ratio of amplitudes of successive output signals for a given frequency component being a first constant and with a difference of phases of successive output signals for a given frequency component being a second constant;

providing a correction network having J ordered input ports, K ordered output ports, K ordered summing elements coupled to respective output ports, and $J \times K$ correction elements, $w_{jk}$, each $w_{jk}$ coupling a jth input port to the kth summing element and having an adjustable correction weight;

coupling each of said J ordered ports to a respective one of said J ordered input ports;

determining the value of an error matrix, E, defining an error between the transfer functions of the set non-ideal filter elements and the transfer functions of a set of ideal filter elements;

determining a value of the elements $c_{ij}$, of the matrix $(I+E)^{-1}$ where I is the identity matrix; and setting the correction weight of each weighting element, $w_{jk}$, equal to $c_{ij}$ for $j=i$ and $k=j$.

2. A method for calibrating a system for correcting transfer functions of a non-ideal series filter network comprising:

providing a filter network of non-ideal filter elements, having an input port for receiving a test signal and having J ordered output ports for generating J ordered output signals at respective output ports, with the ratio of amplitudes of successive output signals for a given frequency component being a first constant and with a difference of phases of successive output signals for a given frequency component being a second constant;

providing a correction network having J ordered input ports, K ordered output ports, K ordered summing elements coupled to respective output ports, and $J \times K$ correction elements, $w_{jk}$, each $w_{jk}$ coupling a jth input port to the kth summing element and having an adjustable correction weight;

coupling each of said J ordered ports to a respective one of said J ordered input ports;

determining the value of an error matrix, E, defining an error between the transfer functions of the set non-ideal filter elements and the transfer functions of a set of ideal filter elements;

approximating the value of the elements $c_{ij}$, of the matrix $(I+E)^{-1}$ where I is the identity matrix; and setting the correction weight of each weighting element, $w_{jk}$, equal to $c_{ij}$ for $j=i$ and $k=j$.

3. A system for transforming a test signal having a plurality of frequency components into a discrete representation comprising:

a set of K filter elements, each with an input and output port, connected in series, with the input port of the first filter element coupled to a filter network input port with K ordered outputs coupled respectively to the output ports of respective filter elements for generating K ordered output signals characterized by an amplitude and phase angle at respective output ports, with the ratio of the amplitudes of successive output signals being a first constant and with a difference of the phase angles being a second constant where the filter elements are Laguerre filter elements, where the transfer function for the first filter element in the set is $$\frac{\sqrt{\alpha}}{s+\alpha/2}$$

where $s = \sigma + jw$ and represents a frequency in the complex frequency domain and $\alpha$ is a physical scaling parameter and where the transfer function for each remaining filter elements is $$\left(\frac{\alpha/2 - s}{\alpha/2 + s}\right)$$

so that the transfer function at the kth output port is $$\left(\frac{\alpha/2 - s}{\alpha/2 + s}\right)^k$$

where k is the rank of the output port.

4. A system for transforming a test signal having a plurality of frequency components into a discrete representation comprising:

K parallel filter branches, each filter branch having an input port, an output port, and including a set of one or more filter elements connected in series, with the input ports of each branch coupled to a network input port with the output ports of each filter branch coupled, respectively, to one of a set of K ordered output ports for generating K ordered output signals characterized by an amplitude and phase angle at respective output ports, with the ratio of the amplitudes of successive output signals being a first constant and with a difference of the phase angles being a second constant where the filter elements are Poisson filter elements, where the transfer function for the first filter element is $$\frac{1}{s+\alpha/2},$$

$s = \sigma + jw$ and represents a frequency in the complex frequency domain and $\alpha$ is a physical scaling parameter and where the transfer function for the remaining filter elements is $$\left(\frac{\alpha}{s+\alpha/2}\right)$$

so that the transfer function at the kth output port is $$\left(\frac{\alpha}{s+\alpha/2}\right)^k$$

where k is the rank of the output port.

5. A system for transforming a test signal having a plurality of frequency components into a discrete representation comprising:

a set of K filter elements, each with an input and output port, connected in series, with the input port of the first filter element coupled to a filter network input port with K ordered outputs coupled respectively to the output ports of respective filter elements for generating K ordered output signals characterized by an amplitude and phase angle at respective output ports, with the ratio of the amplitudes of successive output signals being a first constant and with a difference of the phase angles being a second constant where the filter elements are Poisson filter elements, where the transfer function for the first filter element is $$\frac{1}{s+\alpha/2},$$

$s = \sigma + jw$ and represents a frequency in the complex frequency domain and $\alpha$ is a physical scaling parameter and where the transfer function for the remaining filter elements is $$\left(\frac{\alpha}{s+\alpha/2}\right)$$

so that the transfer function at the kth output port is $$\left(\frac{\alpha}{s+\alpha/2}\right)^k$$

where k is the rank of the output port.

6. A system for transforming a test signal having a plurality of frequency components into a discrete representation comprising:

K parallel filter branches, each filter branch having an input port, an output port, and including a set of one or more filter elements connected in series, with the input ports of each branch coupled to a network input port with the output ports of each filter branch coupled, respectively, to one of a set of K ordered output ports for generating K ordered output signals characterized by an amplitude and phase angle at respective output ports, with the ratio of the amplitudes of successive output signals being a first constant and with a difference of the phase angles being a second constant where the filter elements are Laguerre filter elements, where the transfer function for the first filter element in the set is is $$\frac{\sqrt{\alpha}}{s + \alpha/2}$$

where $s = \sigma + jw$ and represents a frequency in the complex frequency domain and $\alpha$ is a physical scaling parameter and where the transfer function for each remaining filter elements is $$\left(\frac{\alpha/2 - s}{\alpha/2 + s}\right)$$

so that the transfer function at the kth output port is $$\left(\frac{\alpha/2 - s}{\alpha/2 + s}\right)^k$$

where k is the rank of the output port.

* * * * *